(12) United States Patent
Asghari

(10) Patent No.: US 6,498,666 B1
(45) Date of Patent: Dec. 24, 2002

(54) INTEGRATED OPTICAL TRANSCEIVER

(75) Inventor: Mehdi Asghari, Swindon (GB)

(73) Assignee: Bookham Technology Limited, Oxon (GB)

( * ) Notice: Subject to any disclaimer, the term of this patent is extended or adjusted under 35 U.S.C. 154(b) by 0 days.

(21) Appl. No.: 09/083,175

(22) Filed: May 22, 1998

(51) Int. Cl.[7] .............................. H04B 10/00; H01S 3/08
(52) U.S. Cl. .................. 359/152; 359/154; 359/173; 359/130; 372/92; 372/102
(58) Field of Search .................. 359/152, 154, 359/130; 372/20, 32, 29.022, 99, 102, 92

(56) References Cited

U.S. PATENT DOCUMENTS

| | | | |
|---|---|---|---|
| 3,758,185 A | * | 9/1973 | Gelber .......................... 350/1 |
| 3,932,881 A | * | 1/1976 | Mita et al. ..................... 357/17 |
| 4,730,330 A | | 3/1988 | Plihal et al. .................... 372/50 |
| 4,989,935 A | | 2/1991 | Stein ........................ 350/96.11 |
| 5,124,859 A | * | 6/1992 | Martin et al. ................. 359/886 |
| 5,181,264 A | * | 1/1993 | Chiaretti et al. ............... 385/33 |
| 5,230,005 A | * | 7/1993 | Rubino et al. ................. 372/20 |
| 5,400,419 A | | 3/1995 | Heinen .......................... 385/14 |
| 5,555,334 A | * | 9/1996 | Ohnishi et al. ................ 385/93 |
| 5,663,821 A | * | 9/1997 | Suda et al. ................... 359/152 |

FOREIGN PATENT DOCUMENTS

| | | | |
|---|---|---|---|
| GB | 2 307 786 A | 6/1997 | ............ G02B/6/42 |
| GB | 2 315 595 A | 2/1998 | ............ G02B/6/42 |
| GB | 2 317 023 A | 11/1998 | ............ G02B/6/14 |
| WO | WO 95/08787 | 3/1995 | ........... G02F/1/025 |

OTHER PUBLICATIONS

Patent Abstracts of Japan, vol. 17, No. 401, p. 43 E 1404.

* cited by examiner

Primary Examiner—Jason Chan
Assistant Examiner—M. R. Sedighian
(74) Attorney, Agent, or Firm—Fleshner & Kim, LLP

(57) ABSTRACT

An integrated optical transceiver comprising: a laser cavity formed between first and second feedback elements (3,7), wavelength selective means, eg a diffraction grating (4), within the laser cavity for determining a lasing wavelength thereof and a light receiver (10), one of the feedback elements (3) being partially transmissive at the lasing wavelength to enable the transceiver to emit radiation at the lasing wavelength, and the wavelength selective means (4) being arranged to receive light through the feedback element (3) and transmit light of a selected wavelength, differing from the lasing wavelength, to the light receiving means (10).

18 Claims, 1 Drawing Sheet

INTEGRATED OPTICAL TRANSCEIVER

BACKGROUND OF THE INVENTION

1. Field of the Invention

This invention relates to an integrated optical transceiver and more particularly a transceiver employing an inter cavity demultiplexer resonator for use in optical communication systems.

2. Background of the Related Art

Multi-wavelength optical communication networks can significantly increase transmission capacity, enhance system flexibility and allow for more flexible and novel system management schemes. A major problem with the costeffective effective realizatiion of such systems is the achievement of stable multiwavelength wavelength transceiver and detector devices with accurate channel wavelength definition and low temperature sensitivity. The latter is to conserve wavelength registration and so allow communication of different devices at different parts of the system that may be at different temperatures. Wavelength selected Distributed Feed Back (DFB) devices used in the prior art suffer from requiring accurate temperature control, lack of wavelength definition on fabrication and high coupling losses on coupling the channels into a single output.

Integration of active or passive wavelength selective devices within laser or detector structures to form integrated multi-wavelength transmitter or receiver devices capable of transmitting or detecting a number of wavelengths simultaneously has been proposed. It is also known that such wavelength selective devices can be formed inside a laser cavity to allow laser oscillation on a number of wavelength channels. The wavelength selective device used in such arrangements is usually a grating based structure typically integrated with lenses or mirrors to perform the required beam manipulation.

SUMMARY OF THE INVENTION

The present invention aims to improve upon such devices by providing an integrated multi-wavelength transceiver.

According to a first aspect of the present invention there is provided an integrated optical transceiver comprising a laser cavity formed between first and second feedback elements, wavelength selective means within the laser cavity for determining a lasing wavelength of the laser cavity and light receiving means, at least one of the feedback elements being partially transmissive at the lasing wavelength so as to permit the transceiver to emit radiation of the lasing wavelength, and the wavelength selective means being arranged to receive light through one of the feedback elements and transmit light of a selected wavelength, differing from the lasing wavelength, to the light receiving means.

Such a transceiver is capable of detecting incoming data on one or a set of wavelengths and simultaneously transmitting data on a different wavelength or set of wavelengths.

The wavelength selective means determines the lasing wavelength by being part of the laser cavity and also determines the selected wavelength transmitted to the light receiving means, and therefore determines both the wavelength transmitted by the transceiver and the wavelength received by the transceiver.

According to another aspect of the invention there is provided a matched pair of such transceivers.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will now be further described, merely by way of example, with reference to the accompanying drawings, in which.

DETAILED DESCRIPTION OF THE PREFERRED EMBODIMENTS

A single wavelength transmission and detection transceiver is described below but the arrangement described can be extended to any number of wavelength channels.

Figure 1:
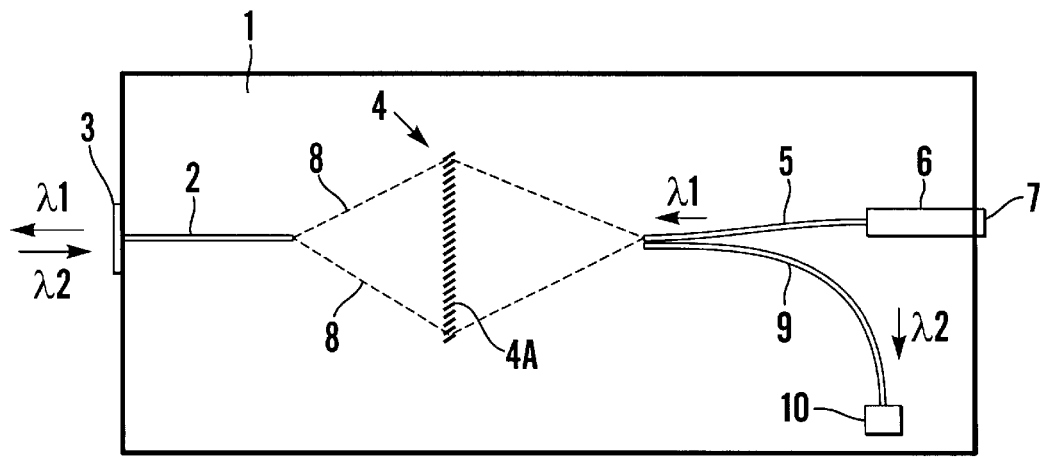
FIG. 1 is a schematic diagram showing a first embodiment of an integrated optical transceiver according to the invention.

FIG. 1 shows an optical chip 1, e.g., a silicon-on-insulator chip, on which the transceiver is formed. An integrated waveguide 2, e.g., a silicon rib waveguide, extends from a first feedback element 3, e.g., a polished, partly anti-reflective (AR) coating formed on a facet at one end of the waveguide 2 towards wavelength selective means 4, e.g., a transmission grating formed by a series of narrow, shallow grooves 4A, etched in the surface of the optical chip 1. A further waveguide 5 is formed on the chip 1 at a position to receive light at a selected angle from the transmission grating 4 and leads, via an optical amplifier 6, e.g., a semiconductor laser amplifier chip, to a second feedback element 7, e.g., a high reflection (HR) coated facet of the optical amplifier 6. In the example shown, the grating comprises a linear array of chirped period apertures so it also focusses the light transmitted therethrough.

Light travelling along the waveguide 2 towards the transmission grating 4 diverges into the silicon layer, as represented by the dashed lines 8 as it leaves the waveguide 2. Light leaves the transmission grating 4 in the form of an interference pattern generated by the linear array of chirped period apertures forming the grating in the well-known manner and comprises a series of peaks at different angular positions relative to the axis of the grating (i.e. an axis perpendicular to the grating and co-linear with the waveguide 2), each peak comprising light of a particular wavelength or wavelength band.

The waveguide 5 is positioned so as to receive light of a selected wavelength Xi, which is to be the wavelength transmitted by the transceiver. Light of this wavelength is amplified in an optical cavity formed between the AR coating 3 and the HR coating 7 in a known manner, and as the AR coating is only partially reflective, part of this light is transmitted from the transceiver through the AR coating 3 as the output of the transceiver at the wavelength $\lambda_1$.

Another waveguide 9 is also provided on the chip at a selected angle so as to receive light of a second wavelength $\lambda_2$ from the transmission grating 4 and transmits this light to a detector 10, e.g., a photodiode.

The spacing required between the waveguides 5 and 9 so they receive the respective wavelengths $\lambda_1$ and $\lambda_2$ is generally in the order of 10–20 microns depending upon the dimensions and geometry of the arrangement.

The transmission grating thus acts to direct light of the second wavelength $\lambda_2$ received by the transceiver through the partly anti-reflective coating 3 to the photodiode 10.

The wavelength selective structure 4 is thus integrated as part of an optical cavity formed between the partly anti-reflection (AR) coated facet 3 and the high reflection (HR) coated facet 7 of the optical amplifier chip 6. The grating 4 is used to set the relative wavelengths of both the transmitted and received data inside the same optical chip 1. The grating 4 sets the transmitted wavelength of the tranceiver by being part of the optical cavity and acting as a wavelength selective filter. At the same time, the grating 4 also acts as a bandpass filter ensuring that the detector 10 is illuminated by the correct range of wavelengths.

The wavelength selectivity of the grating 4, therefore, enables the formation of a closed cavity for laser oscillation at one wavelength $\lambda_1$ and the free detection of another wavelength $\lambda_2$ at the detector. The detector 10 is physically part of the laser resonator but is separated from it in the wavelength domain. The photodiode 10 terminating the waveguide 9 acts as a highly efficient absorber and prevents the formation of oscillations at that wavelength.

FIG. 1 schematically illustrates one embodiment of such a transceiver. Data on wavelength $\lambda_2$ is coupled into the device and is demultiplexed by the grating structure 4 to illuminate the detector 10. As indicated above, the embodiment shown in FIG. 1 incorporates a chirped focusing grating 4 to perform both demultiplexing and focusing.

Figure 2:
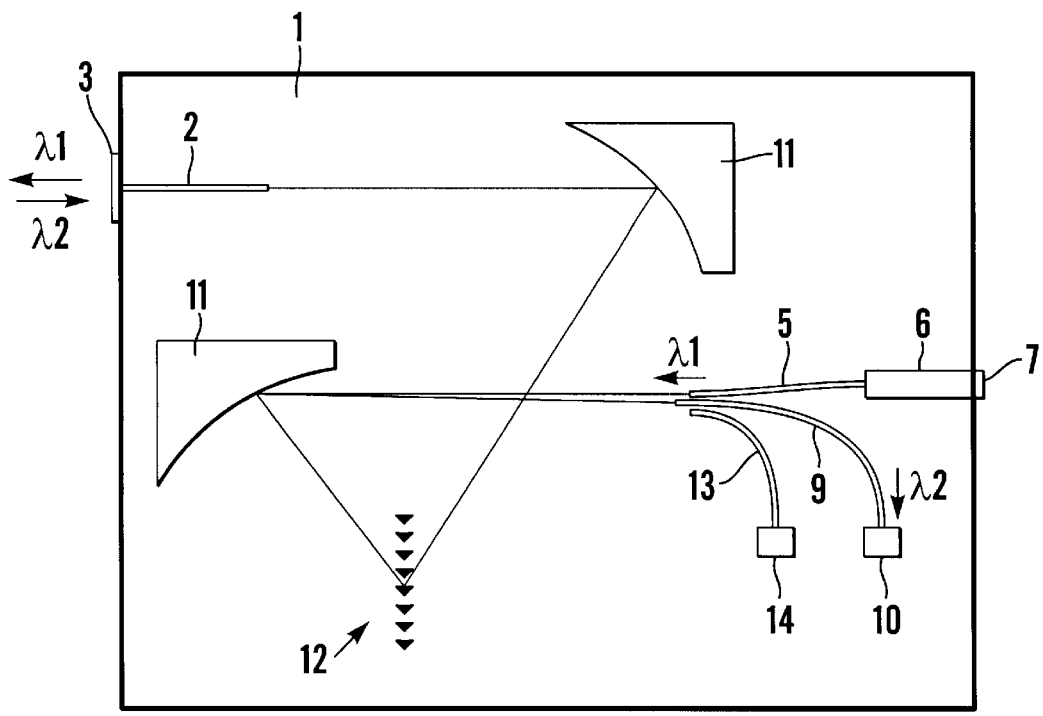
FIG. 2 is a schematic diagram showing a second embodiment of an integrated optical transceiver according to the invention.

FIG. 2 shows another embodiment of the present invention which uses a combination of collimating and focusing mirrors 11 etched in the optical chip 1 together with a reflection grating 12. The mirrors 11 and reflection grating 12 can be formed by deep etches in the surface of the chip 1.

The lasing wavelength of the optical cavity is determined by the grating demultiplexer 12 by providing wavelength selective feedback at $\lambda_1$ in the optical amplifier 6.

The detected wavelength $\lambda_2$ received by the device is directed by the mirrors 11 and the reflection grating 12 to the detector 10. The grating 12 is thus again included in the optical cavity, multiplexing and demultiplexing the radiated lasing wavelength from that of the input data during each round trip cycle. This isolates the detector 10 and forms a laser cavity between the high reflection coated facet 7 through the grating demultiplexer 12 to the partially anti-reflection coated facet 3.

If the wavelengths $\lambda_1$ and $\lambda_2$ are significantly different, the anti-reflection coating on the facet 3 can be designed to have a lower value (i.e. be less reflective) for the detected wavelength $\lambda_2$ to improve coupling efficiency, and a higher value (i.e. be more highly reflective) for the transmitted wavelength X, to reduce the lasing threshold of the optical cavity.

The transceivers described above have a number of significant advantages:

The inclusion of the passive grating demultiplexer 12 removes any wavelength registration problems between the transmitted and detected wavelengths of transceivers located at different parts of the system. This is due to the fact that the detected and transmitted wavelengths are set by the same passive demultiplexer device. For instance, in the above example, the emitted laser light at $\lambda_1$ is determined by the demultiplexer geometry which can be defined very accurately and fabricated to high tolerances, e.g., by photolithographic processes which enable the grating 12 to be formed to sub-micron accuracy. This wavelength is thus automatically matched to the detected wavelength of another transceiver as that transceiver will also use exactly the same demultiplexer but with the laser and detector wavelengths swapped. Since the passive demultiplexer 12 is effectively identical in both cases, the wavelengths will be identical and thus automatically self-aligned.

The inclusion of the grating element forces laser oscillation at a particular wavelength defined by the grating. This wavelength can be set very accurately (to better than 0.05 nm) and may, on the one hand, be designed to be sufficiently narrow to allow reduction of chirp and dispersion penalty but, on the other hand, sufficiently broad to enable stable and linear light current response (by averaging out mode hopping effects).

Also, by tapering-in the waveguide 5 coupling the optical cavity to the grating, i.e., by reducing the height and/or the width of the waveguide 5 as it approaches the grating 4 or 12, the spectral line-width of the light coupled into the optical cavity can be reduced.

The transceiver also has reduced temperature sensitivity. Temperature dependence arises from two factors:
  i) Thermal expansion changing the grating pitch. The thermal expansion coefficient of silicon is $4.6 \times 10^{-6}$. $K^{-1}$ and for typical device designs, this results in a change of emitted laser wavelength of 0.7 nm over the temperature range −40 to 85° C.
  ii) Refractive index variation with temperature: this changes the operating wavelength of the grating. The change in refractive index with temperature for Si is $1.86 \times 10^{-4}$ $K^{-1}$. For typical device designs, over the temperature range −40 to 85° C., this will result in a wavelength change of approximately 9 nm.

The resulting wavelength variations with refractive index are thus an order of magniture larger than the corresponding variations due to thermal expansion. However, even a 9 nm shift over the stated 125° C. temperature range due to index variation is significantly less than that which would have been obtained using prior art devices such as a Fabry-Perot laser.

It should also be noted that wavelength variation with temperature due to an active (laser) element on device performance is avoided as the wavelength is set by the passive grating device.

The resulting reduction in wavelength shift with temperature combined with the reduction in emitted laser line-width reduces the required tolerance on channel wavelengths significantly. With a transceiver device working with the two wavelengths of 1310 nm and 1550 nm, for example, a channel width of approximately 100 nm is required if prior art Fabry-Perot lasers are employed without any temperature stabilization. This can be reduced to 10 nm if the transceiver of the present invention is employed with such lasers.

Tapering of the detector waveguide 9, i.e., by reducing the height and/or increasing the width so as to increase the width of the waveguide mode as it approaches the grating 4, 12, can also be used to accommodate the wavelength variation of the incoming data over this 9 nm range with less than 1 dB penalty on channel loss. For example, the waveguide 9 can be tapered out from its standard 4 microns, width to 20 microns resulting in a broadening of the detector response so that any changes in emitted laser wavelength due to temperature can be accommodated.

For large channel separations, such as the 1310 nm to 1550 nm separation discussed above, it is difficult to achieve the required channel separation within the free spectral range (FSR) of the grating. To overcome this, the grating is designed for operation outside the FSR but in such a way that crosstalk with any of the other modes present is avoided or minimised. To ensure this, the device is designed so that the wavelengths corresponding to potentially interfering modes are not present at the input to the waveguide 9.

The transceiver described above can also be designed to transmit and/or receive on more than one wavelength band by providing further waveguides on the chip to transmit other wavelengths into additional laser cavities, similar to that described above, and to receive other wavelengths into additional detectors, similar to that described above. With waveguides approximately 4 microns wide, spaced about 10 microns apart, it would, for example, be possible to form up to 32 waveguides in the focal plane of the grating thereby enabling the transceiver to transmit on 16 wavelengths and receive on 16 wavelengths.

The transceiver arrangement described above also facilitates two possible methods for monitoring the light emitted from the optical cavity. The first is to sample the light inside the optical cavity using the grating. The grating can be designed to carry a small but finite proportion of the optical power in a lower or higher order diffraction mode. This can be coupled to a further tap-off waveguide 13 and coupled to a further photodiode 14 (see FIG. 2). By correct design, the spatial separation of this higher order mode should be sufficiently different from that of the emitted and detected wavelengths $\lambda_1$ and $\lambda_2$ to allow well-spaced waveguides at the focal plane.

The second method is based on monitoring the power emitted from the back facet 7 of the optical amplifier 6. This can be reflected from an angled mirror and coupled to a suitable detector. In this case, the optical amplifier 6 would be mounted away from the edge of the chip to allow room for the mirror and detector to be formed on the chip.

It will be appreciated that in order to maximise the receiver sensitivity of the transceiver, the detected wavelength $\lambda_2$ should preferably coincide with a peak of the diffraction profile produced by the grating 4, 12.

It will also be appreciated that in the design of the AR coating on the facet 3 a compromise has to be reached between the desire to reduce optical cavity losses (to reduce laser threshold current) by increasing its reflectivity for wavelength $\lambda_1$ and the desire to increase the receiver sensitivity by reducing its reflectivity for wavelength $\lambda_2$ (to reduce coupling losses for incoming data).

An AR coating having a reflectivity of about 20% (for both wavelengths), for example, will result in a 1 dB increase in coupling loss for the received power, (i.e. a 1 dB reduction in sensitivity) compared to a coating with a 0% reflectivity. The corresponding increase in laser threshold current will be around 30% compared to the use of an HR coating with 80% reflectivity.

As indicated above, the transceiver described herein is preferably formed on a silicon-on-insulator (SOI) chip. An SOI chip enables easy integration of the various components of the transceiver and relatively low fabrication costs.

Further details of SOI chips and rib waveguides formed thereon are given in WO95/08787.

Methods of mounting components such as photodiode detectors on an SOI chip are described in GB2307786A and in co-pending application no. GB9702559.7 (publication no. GB2315595A). A tapered rib waveguide structure is described in co-pending application no. 9702579.5 (publication no. GB2317023A). The above applications and publications are incorporated by reference herein where appropriate for appropriate teachings of additional or alternative details, features and/or technical background.

The fabrication of a transmission and reflection grating on the surface of an optical chip by electron beam or photolithographic techniques is well known in the art, so it will not be described in detail. The transmission grating 4 is generally formed of shallow grooves a fraction of a micron in depth (e.g. 0.2 micron width and a few microns in length. The period is chirped and would typically vary from a fraction of a micron to a few microns.

The reflection grating 12 is generally formed of deep etched features with reflecting surfaces 5–20 microns wide, spaced about 5–20 microns apart and the grating may typically have a length of about 500 microns.

The mirrors 11 would also be formed by deep etches, extending all the way through the light guiding layer, and be from a few hundred microns to a few millimeters wide. The mirrors are preferably concave as shown in FIG. 2 so as to collimate and focus the light and may also have a reflective coating such as a coating of aluminum applied thereto. As indicated above, the grating and mirrors can be fabricated with great accuracy using known photolithographic etching processes, e.g. to within an accuracy of about 0.2 microns. Such accuracy is repeatable so enabling transceivers to be fabricated with accurately matched transmission and receiving wavelengths.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a focusing mirror and a lens may not be structural equivalents in that a focusing mirror employs a curved reflective surface to focus light, whereas a lens employs a curved transmissive surface to focus light via refraction, in the environment of focusing light, a focusing mirror and a lens may be equivalent structures.

What is claimed is:

1. An integrated optical transceiver comprising a laser cavity formed between first and second feedback elements, a diffraction grating within the laser cavity for determining a lasing wavelength of the laser cavity and light receiving means, as least one of the feedback elements being partially transmissive at the lasing wavelength so as to permit the transceiver to emit radiation of the lasing wavelength, the diffraction grating being arranged to receive light through one of the feedback elements and transmit light of a selected wavelength, differing from the lasing wavelength, to the light receiving means, a first optical waveguide being provided to transmit and receive light to and from the diffraction grating at a first angle corresponding to an angle formed by the lasing wavelength received from the grating and a second optical waveguide being provided to receive light from the grating at a second angle corresponding to an angle formed by the selected wavelength is received from the grating.

2. A transceiver as claimed in claim 1 in which the second waveguide has a relatively wide receiving end for receiving light at a range of angles from the diffraction grating and a narrower transmission portion for transmitting the light to the light receiving means.

3. A transceiver as claimed in claim 1 formed on an optical chip in which the diffraction grating comprises a transmission grating or reflection grating formed by a series of recesses in the surface of the chip.

4. A transceiver as claimed in claim 1 in which the wavelength selective means is arranged to determine both the lasing wavelength and the selected wavelength with an accuracy of 10 nm or less, in the presence temperature changes.

5. A transceiver as claimed claim 1 in which one of the feedback elements comprises an anti-reflective coating.

6. A tranceiver as claimed in claim 1 which the anti-reflective coating is more transmissive to the selected wavelength than the lasing wavelength.

7. A transceiver as claimed in claim 1 in which one of the feedback elements comprises a highly reflective coating, preferably arranged to reflect at least 80% of light at the lasing wavelength.

8. A transceiver as claimed in claim 2 in which the wavelength selective means and the laser cavity are arranged such that the transceiver is able to transmit light at a plurality of lasing wavelengths.

9. A tranceiver as claimed in claim 8 further comprising a plurality of optical waveguides arranged to receive a respective lasing wavelength or a respective selected wavelength from the wavelength selective means.

10. A transceiver as claimed in claim 9 in which receiving ends of the plurality of optical waveguides are spaced 20 microns or less from each other.

11. A transceiver as claimed in claim 1 in which the wavelength selective means and the light receiving means are arranged such that the transceiver is able to detect light at a plurality of selected wavelengths.

12. A transceiver as claimed in claim 1 wherein the lasing wavelength and the selected wavelength are selected so as not to interfere with each other.

13. A transceiver as claimed in claim 1, further comprising output monitoring means arranged to monitor light transmitted through one of the feedback elements to monitor the power of the emitted radiation.

14. A transceiver as claimed in claim 1 in which the diffraction grating is arranged to diffract light at the lasing wavelength in a higher or lower order diffraction mode than that received by the first optical waveguide and further comprising output monitoring means for receiving said lasing wavelength in the higher or lower order diffraction mode to monitor the power output of the emitted radiation.

15. A transceiver as claimed in claim 1 in which the light receiving means comprises a light detecting diode.

16. A transceiver as claimed in claim 1 integrated on a silicon-on-insulator chip.

17. A transceiver as claimed in claim 1 having a channel width of 10 nm or less.

18. An integrated optical transceiver, comprising:
an optical resonator formed between first and second feedback elements;
a wavelength selector positioned within the optical resonator to determine a lasing wavelength of the optical resonator that is emitted through one of the feedback elements, and wherein the wavelength selector is also adapted to receive light that is passed into the optical resonator through one of the feedback elements, and to transmit a predetermined wavelength of the received light to a light receiver, the predetermined wavelength differing from the lasing wavelength;
a first optical waveguide positioned to transmit and receive light to and from the wavelength selector at a first angle corresponding to an angle, formed by the lasing wavelength received from the wavelength selector; and
a second optical waveguide positioned to receive light from the wavelength selector at a second angle corresponding to an angle formed by the predetermined wavelength received from the wavelength selector.

* * * * *

UNITED STATES PATENT AND TRADEMARK OFFICE
CERTIFICATE OF CORRECTION

PATENT NO. : 6,498,666 B1
DATED : December 24, 2002
INVENTOR(S) : Mehdi Asghari

It is certified that error appears in the above-identified patent and that said Letters Patent is hereby corrected as shown below:

<u>Title page,</u>
Item [73], should read as follows:
-- Bookham Technology PLC --.

Signed and Sealed this

Twenty-fourth Day of June, 2003

JAMES E. ROGAN
*Director of the United States Patent and Trademark Office*